US011480328B2

(12) United States Patent
Choi (10) Patent No.: US 11,480,328 B2
(45) Date of Patent: Oct. 25, 2022

(54) LED LAMP HAVING METAL PCB BENT POLYHEDRALLY AND MANUFACTURING METHOD THEREOF

(71) Applicant: ECOCAB CO., LTD., Ulsan (KR)

(72) Inventor: Young Cheon Choi, Ulsan (KR)

(73) Assignee: ECOCAB CO., LTD., Ulsan (KR)

( * ) Notice: Subject to any disclaimer, the term of this patent is extended or adjusted under 35 U.S.C. 154(b) by 396 days.

(21) Appl. No.: 16/665,514

(22) Filed: Oct. 28, 2019

(65) Prior Publication Data

US 2020/0318826 A1  Oct. 8, 2020

(30) Foreign Application Priority Data

Apr. 4, 2019 (KR) ................. 10-2019-0039829

(51) Int. Cl.
| *F21V 29/00* | (2015.01) |
| *F21V 29/83* | (2015.01) |
| *H05K 1/18* | (2006.01) |
| *H05K 1/02* | (2006.01) |
| *H05K 1/05* | (2006.01) |
| *H05K 3/22* | (2006.01) |
| *F21V 29/503* | (2015.01) |

(Continued)

(52) U.S. Cl.
CPC ............ *F21V 29/83* (2015.01); *F21V 29/503* (2015.01); *H01L 25/13* (2013.01); *H05K 1/0203* (2013.01); *H05K 1/0274* (2013.01); *H05K 1/056* (2013.01); *H05K 1/181* (2013.01); *H05K 3/22* (2013.01); *F21Y 2103/10* (2016.08); *F21Y 2115/10* (2016.08); *H05K 2201/09018* (2013.01); *H05K 2201/09054* (2013.01); *H05K 2201/09063* (2013.01); *H05K 2201/09072* (2013.01); *H05K 2201/10106* (2013.01); *H05K 2201/10522* (2013.01); *H05K 2201/2054* (2013.01); *H05K 2203/0108* (2013.01); *H05K 2203/033* (2013.01)

(58) Field of Classification Search
CPC ...... H05K 1/0274; H05K 1/056; H05K 1/181; H05K 1/0203; H05K 3/22; F21V 29/83; F21V 29/503
See application file for complete search history.

(56) References Cited

U.S. PATENT DOCUMENTS

| 2005/0202694 | A1* | 9/2005 | Yumoto | ................. H05K 1/147 |
| | | | | 439/67 |
| 2009/0104804 | A1* | 4/2009 | Lin | ........................ H05K 3/202 |
| | | | | 439/211 |

(Continued)

FOREIGN PATENT DOCUMENTS

KR            101589017          1/2016

*Primary Examiner* — Gerald J Sufleta, II
(74) *Attorney, Agent, or Firm* — IPLA P.A.

(57) ABSTRACT

An LED lamp having a metal PCB bent polyhedrally and a method for manufacturing the LED lamp is provided, where a base constituting the metal PCB has a rectangular or geometric shape and is configured to have a plurality of base stepped grooves formed spaced apart from each other on the underside thereof in such a manner as to be bent upward or downward from the base to form reflection surfaces continuously, so that at the time when both ends of the base come into contact with the plane, the base has a geometric shape in which the base is located in space through the reflection surfaces continuously arranged.

5 Claims, 8 Drawing Sheets

(51) Int. Cl.
*H01L 25/13* (2006.01)
*F21Y 115/10* (2016.01)
*F21Y 103/10* (2016.01)

(56) References Cited

U.S. PATENT DOCUMENTS

| | | | | |
|---|---|---|---|---|
| 2011/0228536 | A1* | 9/2011 | Im | F21S 41/192 |
| | | | | 362/249.06 |
| 2012/0113606 | A1* | 5/2012 | Preuschl | H05K 1/028 |
| | | | | 361/752 |
| 2013/0176739 | A1* | 7/2013 | Uehara | H05K 1/056 |
| | | | | 362/296.01 |
| 2014/0063805 | A1* | 3/2014 | Song | F21V 29/70 |
| | | | | 362/249.01 |
| 2014/0306250 | A1* | 10/2014 | Gardner | H05K 3/281 |
| | | | | 257/89 |
| 2015/0003083 | A1* | 1/2015 | Uehara | F21S 43/15 |
| | | | | 362/418 |
| 2015/0103539 | A1* | 4/2015 | Lee | F16M 13/02 |
| | | | | 362/382 |
| 2017/0059141 | A1* | 3/2017 | Song | F21S 45/48 |
| 2017/0170550 | A1* | 6/2017 | Moon | H01Q 9/18 |
| 2018/0010775 | A1* | 1/2018 | Sung | H05K 3/0044 |
| 2018/0209604 | A1* | 7/2018 | Kim | H01L 33/64 |
| 2018/0318898 | A1* | 11/2018 | Troive | B21D 5/01 |
| 2018/0356077 | A1* | 12/2018 | Duong | H05K 1/0277 |
| 2018/0363857 | A1* | 12/2018 | Ren | F21V 29/83 |
| 2019/0093852 | A1* | 3/2019 | Kim | F21S 41/192 |

* cited by examiner

FIG. 1

Prior Art

LED LAMP HAVING METAL PCB BENT POLYHEDRALLY AND MANUFACTURING METHOD THEREOF

CROSS REFERENCE

The present application claims the benefit of Korean Patent Application No. 10-2019-0039829 filed in the Korean Intellectual Property Office on 4 Apr. 2019, the entire contents of which are incorporated herein by reference.

BACKGROUND

The present invention relates to an LED lamp having a metal PCB bent polyhedrally and a method for manufacturing the LED lamp wherein a base constituting the metal PCB has a rectangular or geometric shape and is configured to have a plurality of base stepped grooves formed spaced apart from each other on the underside thereof in such a manner as to be bent upward or downward from the base to form reflection surfaces continuously, so that at the time when both ends of the base come into contact with the plane, the base has a geometric shape in which the base is located in space through the reflection surfaces continuously arranged.

Generally, a printed circuit board (PCB) on which electronic components are mounted is a wiring board made for electrically connecting the electronic components or signal lines together.

Further, a method for manufacturing the PCB includes the step of attaching a copper foil to one side or both sides of an insulation plate made of a phenolic resin and an epoxy resin, forming conductive patterns corresponding to circuits, performing etching for unnecessary portions to remove the copper foil and thus constituting the circuits, punching via holes for connecting electronic components to the PCB and plating the via holes, and applying photo solder resist (PSR) ink to top and underside of the PCB.

Furthermore, LEDs have no large quantity of power consumed, provide long lifetime, and do not produce any environment pollutants, and accordingly, they are generally used for LCDs of cellular phones, display boards, vehicle meter panels, and so on.

As the application range of the LEDs becomes widened, recently, the LEDs have been applied to car indoor lamps, sign boards, back light units (BLU) of liquid crystal displays, lamps for general lighting, car headlights, and the like.

Particularly, an LED lamp module (M) applied to a vehicle includes a reflector for reflecting the light generated from LEDs, a PCB for controlling the LEDs mounted through power supply, a heat sink for radiating the heat generated from the LEDs to the outside, and a back cover for mounting the heat sink.

By the way, the PCBs used for various components as well as the LEDs have relatively low heat radiation effects, and so as to solve such problem, accordingly, a metal PCB, which is made of a metal material such as aluminum, copper alloys, or the like, becomes recently popular on the market.

In addition to the demand for the metal PCB for mounting LEDs, especially, the demand for the metal PCB capable of performing mechanical molding such as bending or pressing has increasingly emerged.

Figure 1:
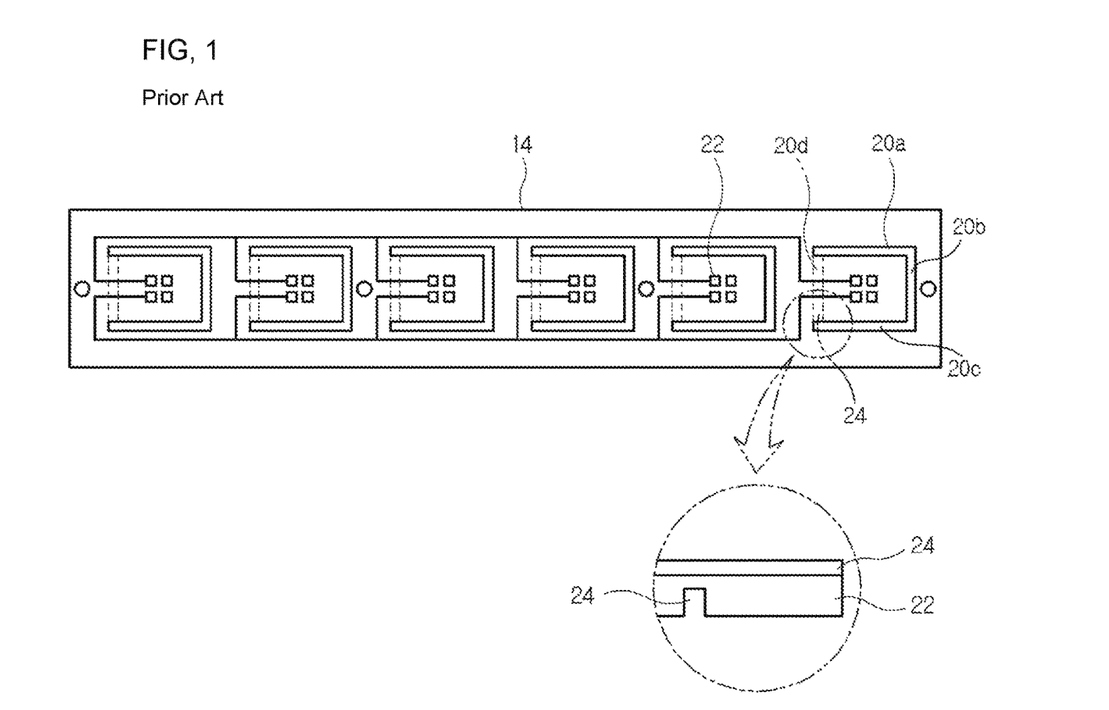
FIG. 1 is a plan view showing a conventional LED lamp module.
Figure 2:
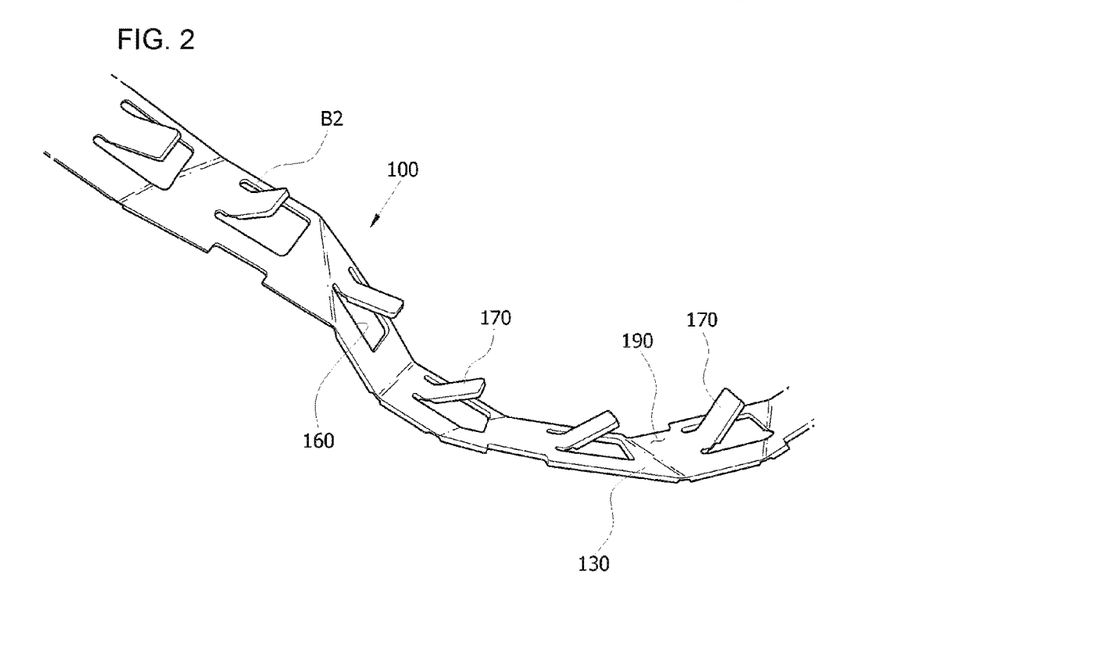
FIG. 2 is a perspective view showing a metal PCB according to the present invention.
Figure 3:
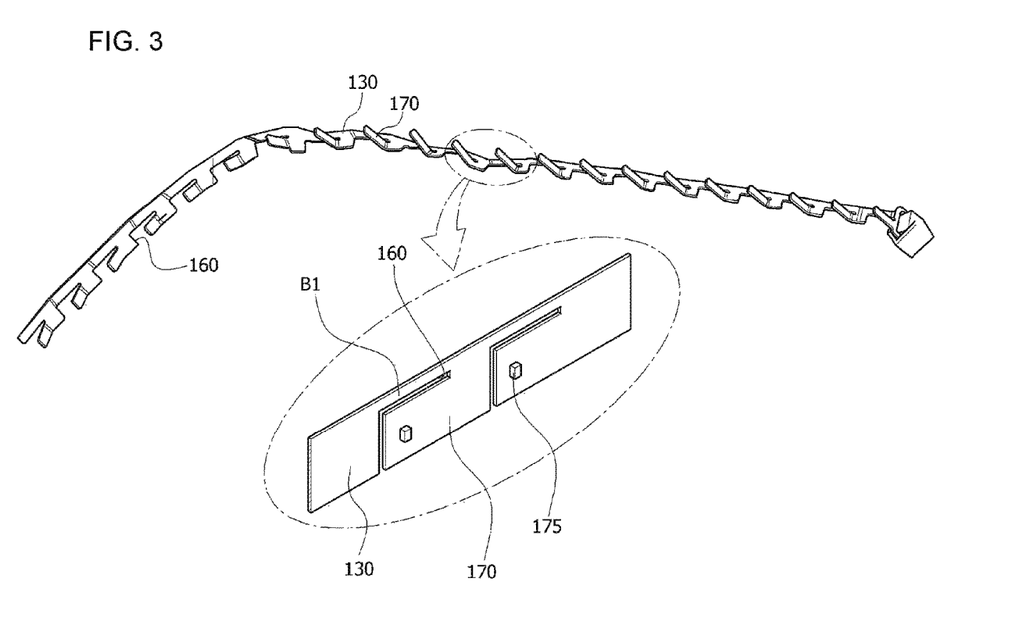
FIG. 3 is a perspective view showing another example of the metal PCB according to the present invention.
Figure 4:
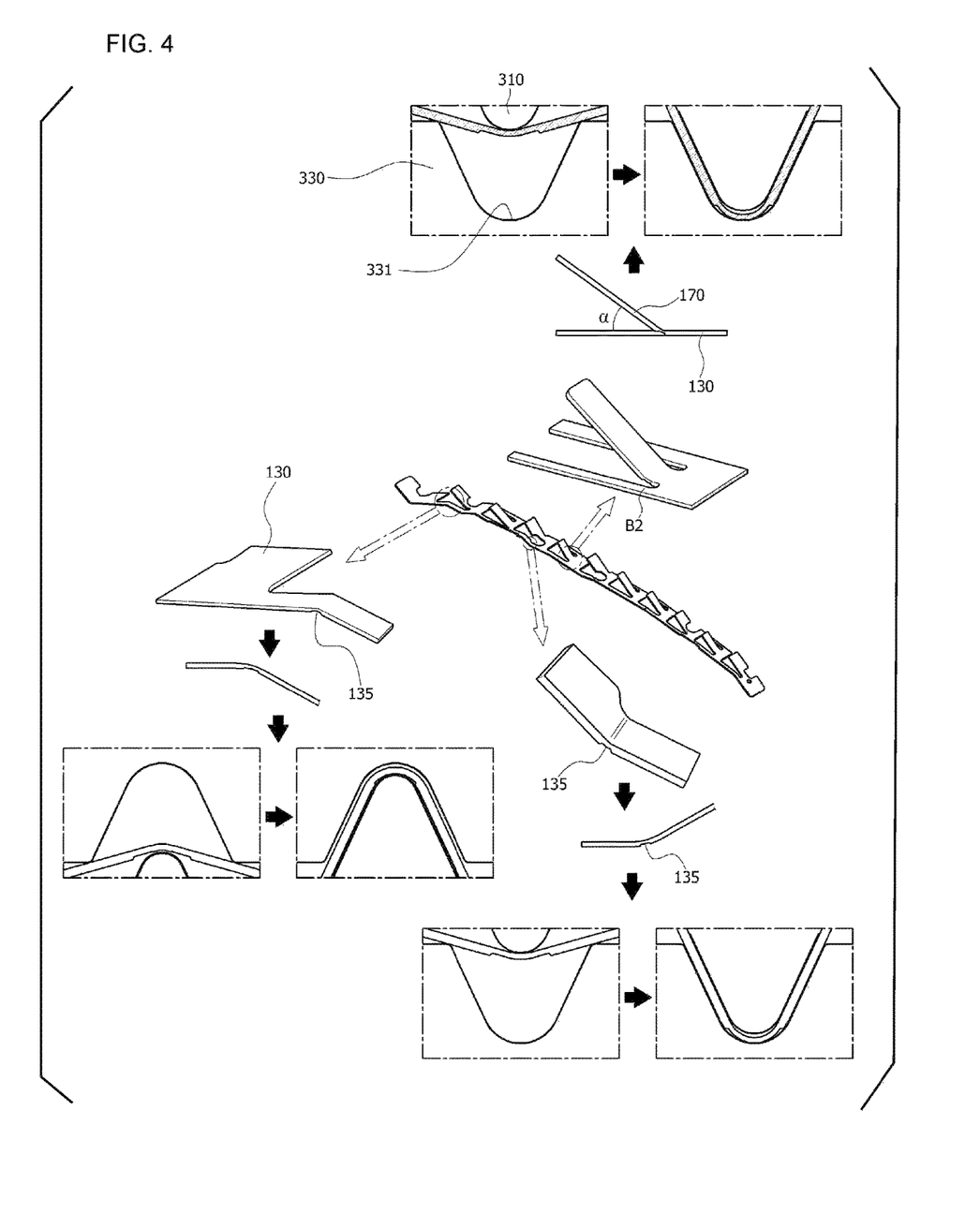
FIGS. 4 and 5 are schematic views showing bent states of a base and a cell in the metal PCB according to the present invention.
Figure 5:
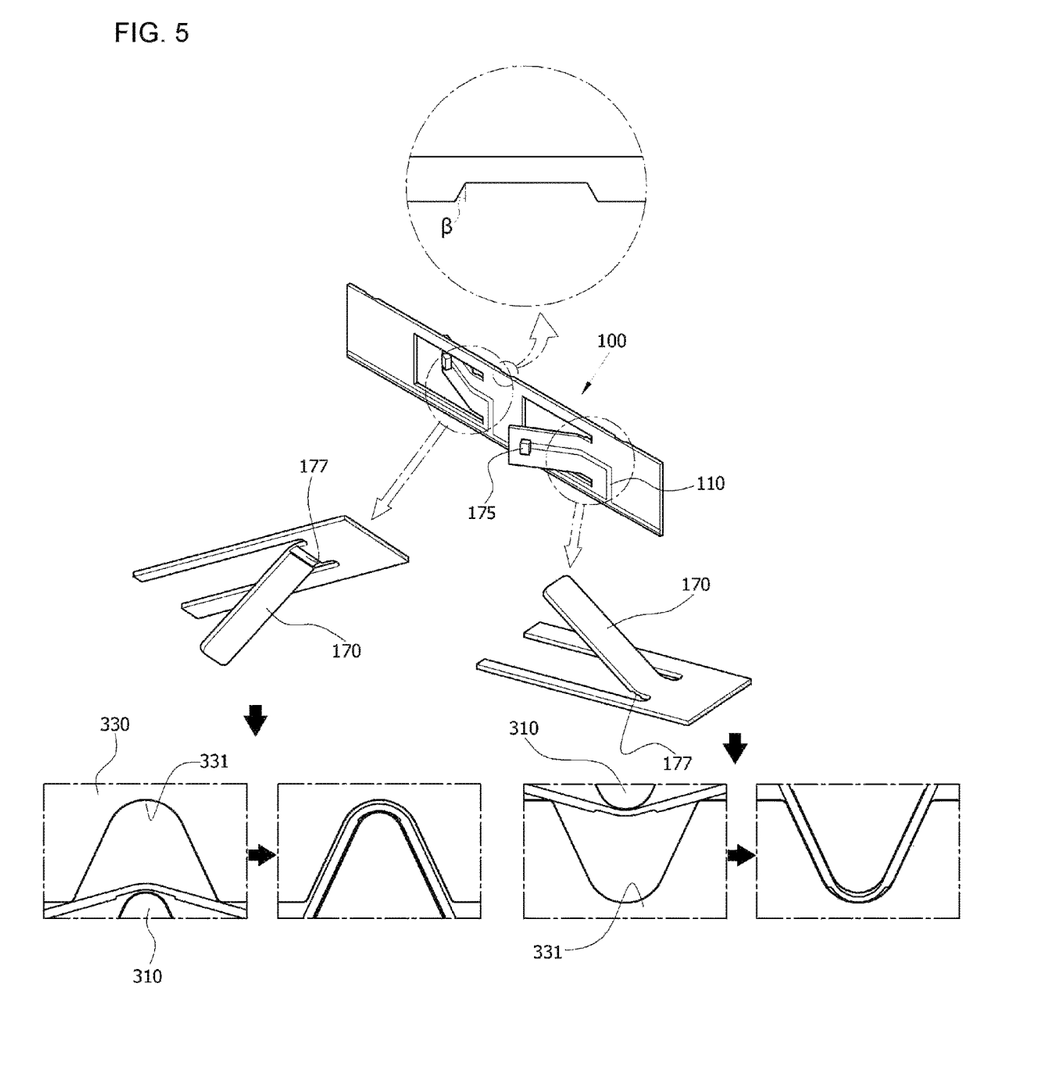

A conventional metal PCB assembly for a car lamp is disclosed in Korean Patent No. 1589017, and as shown in FIG. 1, the metal PCB assembly for a car lamp includes: a metal PCB 14; at least one unit pattern 22 whose three edges are incised and whose one edge is connected to the metal PCB 14 in such a manner as to protrude from the metal PCB 14 in a state of being inclined at a given angle; and an injection molded material coupled to the metal PCB 14 and having a support protruding from the horizontal plane thereof to support the unit pattern 22 to allow the unit pattern 22 to be maintained at the given angle, wherein the metal PCB assembly further includes bent grooves 24 formed to a given depth on the underside of the metal PCB 14 to allow the unit pattern 22 on which LEDs are mounted to be pushed forward around each bent groove 24, so that the metal PCB assembly has a shape of a stair even with a small force.

At this time, the three outer edges 20*a*, 20*b* and 20*c* of the unit pattern 22 are incised and one outer edge 20*d* thereof is connected unitarily to the metal PCB 14, so that the unit pattern 22 protrudes from the metal PCB 14 to the given angle in such a manner as to allow one side thereof to be connected with the metal PCB 14, while being not completely separated from the metal PCB 14.

According to the conventional metal PCB assembly for a car lamp, however, it is hard to install the metal PCB assembly on a place having a geometric shape because the metal PCB 14 is flat, and also, the three outer edges 20*a*, 20*b* and 20*c* of the unit pattern 22 should be incised, so that disadvantageously, it is difficult to take a desired shape.

In addition, the bent groove 24 for bending work is formed, without any separate standard, so that cracks may occur during the bending work to cause reliability in a product to be undesirably deteriorated.

SUMMARY OF THE INVENTION

Accordingly, the present invention has been made in view of the above-mentioned problems occurring in the related art, and it is an object of the present invention to provide an LED lamp having a metal PCB bent polyhedrally and a method for manufacturing the LED lamp that are capable of performing accuracy in a raw material and a standard size to minimize damages to a product at the time when the metal PCB is bent.

It is another object of the present invention to provide an LED lamp having a metal PCB bent polyhedrally and a method for manufacturing the LED lamp that are capable of easily performing heat transfer, while the metal PCB is being manufactured to various shapes.

It is yet another object of the present invention to provide an LED lamp having a metal PCB bent polyhedrally and a method for manufacturing the LED lamp that are capable of preventing damages to the metal PCB, while achieving the accuracy in angle adjustment for cells.

It is still another object of the present invention to provide an LED lamp having a metal PCB bent polyhedrally and a method for manufacturing the LED lamp that are capable of minimizing pressure collection on stepped grooves, preventing deformation from occurring upon molding, and easily performing heat transfer.

To accomplish the above-mentioned objects, according to an aspect of the present invention, there is provided an LED lamp having a metal PCB bent polyhedrally, the metal PCB including: a base having conductive patterns formed on top thereof; and a plurality of cells having LED chips mounted on one side of the base in such a manner as to allow one edge thereof to be connected to the base, each cell being bent in a desired direction from the base through a cell stepped groove concavely shaped on the underside thereof, wherein the base has a shape of a rectangular or geometric band on the top thereof and comprises a plurality of base stepped grooves concavely shaped unitarily with the underside thereof in such a manner as to be spaced apart from each other to be in parallel or inclined with respect to each other on the plane and reflection surfaces continuously formed when the base is bent in an upward or downward direction through the base stepped grooves, so that when both ends of the base come into contact with the plane, the base has a geometric shape in which the base is located in space through the reflection surfaces continuously arranged.

According to the present invention, desirably, the base and each cell are made of an aluminum material having a thermal resistance of 30° C./w or less, depths of the cell stepped grooves and the base stepped grooves are formed to allow the base or the cells to have a thickness ranging from 0.4 to 0.6 mm, and the base or each cell is bent to have an angle of 60° or less with respect to the center line of each base stepped groove or the cell stepped groove.

According to the present invention, desirably, each base stepped groove and each cell stepped groove have inclined surfaces formed unitarily with both sides thereof in a transverse direction thereof, and the base and each cell are coupled integrally with a back plate whose top surface is formed correspondingly to the bent reflection surfaces and cells, the back plate being configured to allow the base to be built in on the top surface thereof.

According to the present invention, desirably, the adjacent bases, the adjacent base and cell, and the adjacent cells are bent in the same direction as each other or in different directions from each other, and the base has the reflection surfaces formed continuously in the same direction as each other or in different directions from each other to have the geometric shape in the space.

According to the present invention, desirably, the base is configured to have a shape of a cantilever through the formation of the two incised holes on each cell.

According to the present invention, desirably, the base is configured to have a shape of a double cantilever through the formation of the three incised holes on each cell.

To accomplish the above-mentioned objects, according to another aspect of the present invention, there is provided a method for manufacturing an LED lamp having a metal PCB bent polyhedrally, the method including the steps of: preparing the metal PCB having a linear or geometric shape on the plane, while having conductive patterns formed thereon; punching edges of a plurality of cells so that each cell is separated protrudingly from a base of the metal PCB in such a manner as to allow one side thereof to be connected to the base; forming a cell stepped groove on the underside of the cell whose one surface is connected to the base and forming base stepped grooves on the base in such a manner as to be in parallel to each other or maintained to given inclinations; pressurizing top surfaces of the cell stepped grooves by means of punches to allow the cells to be at the same time bent; pressurizing top or underside surfaces of the base stepped grooves by means of punches to allow the base to be bent inward or outward to form reflection surfaces continuously in the same direction as each other or in different directions from each other; and preparing a back plate having support surfaces corresponding to the bent cells and reflection surfaces and integrally coupling the base and the back plate by means of a mold.

According to the present invention, desirably, at the time when both ends of the base come into contact with the plane, the base has a geometric shape in which the base is located in space through the continuous reflection surfaces.

According to the present invention, desirably, the base is bent by means of a mold having a punch and a concave portion corresponding to the punch.

According to the present invention, desirably, the cells are bent by means of pressing plates and fixing punches fixed to upper and lower sides of a mold and sliders elastically disposed on the mold and having sliding holes adapted to expose the fixing punches to the outside, so that at the time when the pressing plates are pressurized, the cells are bent by means of the fixing punches, while being prevented from being deformed through the pressing plates.

According to the present invention, desirably, the step of bending the base to form the reflection surfaces is divided into a plurality of steps carried out sequentially on the entire surface of the base so as to prevent interference between molds.

According to the present invention, desirably, the base and the cells are mounted on the back plate by means of the mold, and the back plate has coupling means integrally formed therewith to support the base and the cells, the coupling means being any one selected from bonding coupling, piece coupling, thermal fusion coupling, and locking hooks.

BRIEF DESCRIPTION OF THE DRAWINGS

The above and other objects, features and advantages of the present invention will be apparent from the following detailed description of one of the embodiments of the invention in conjunction with the accompanying drawings, in which.

DETAILED DESCRIPTION OF THE INVENTION

Hereinafter, the present invention will be in detail explained with reference to the attached drawings.

A metal PCB 100 according to the present invention includes a base 130 having conductive patterns 110 formed on top thereof and a plurality of cells 170 whose one side is connected to the base 130 and having LED chips 175 mounted thereon.

At this time, a portion of each cell 175 is separated from the base 130 through incised holes 160 formed along the edges of the cell 175.

Further, the cell 175 is bent in a desired direction to a state of protruding from the base 130 through a cell stepped groove 177 concavely shaped on the underside thereof.

Furthermore, a top of the base 130 has a shape of a rectangular or geometric band on the plane.

Also, the base 130 has a plurality of base stepped grooves 135 concavely shaped unitarily on the underside where no conductive patterns 110 are formed in such a manner as to be spaced apart from each other to be in parallel or inclined with respect to each other on the plane.

Further, the base 130 has reflection surfaces 190 continuously formed when it is bent in an upward or downward direction through the base stepped grooves 135.

At this time, the reflection surfaces 190 have shapes of rectangle, square and trapezoid, and at the time when the base 130 is bent, the reflection surfaces 190 are bent so that they are located on the same plane as each other or different planes from each other.

Figure 7:
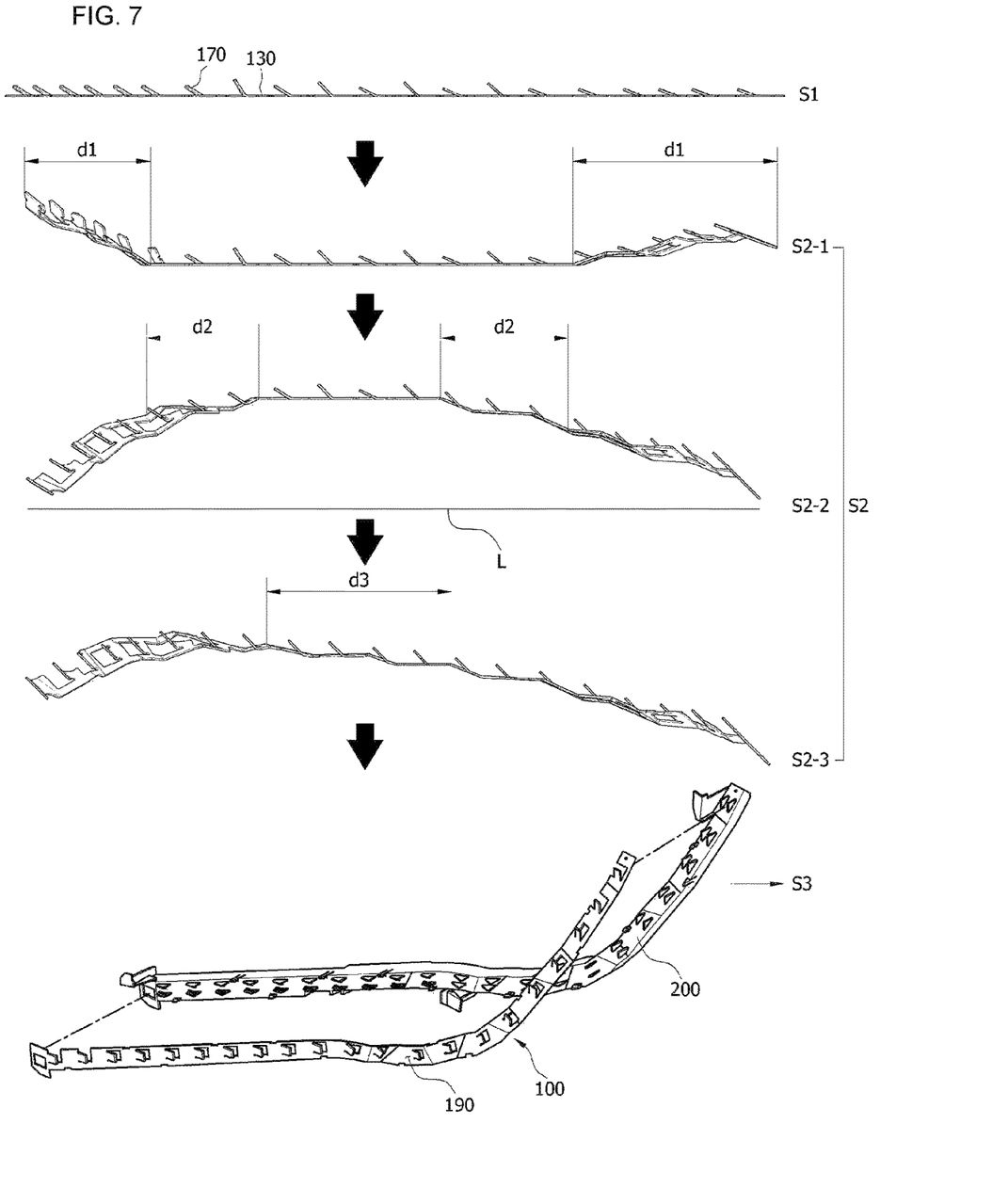
FIG. 7 is a flow diagram showing a method for manufacturing the metal PCB according to the present invention.

Moreover, as shown in FIG. 7, at the time when both ends of the base 130 come into contact with the plane L, the base 130 has a geometric shape in which the base 130 is located in space through the reflection surfaces 190 continuously arranged.

Further, the base 130 is made of an aluminum material having a thermal resistance of 30° C./w or less.

At this time, the base 130 is made of an aluminum alloy, AL 5052.

Further, depths of the cell stepped grooves 177 and the base stepped grooves 135 are formed to allow the aluminum base or cells serving as a radiating plate to have a thickness ranging from 0.4 to 0.6 mm.

Also, the base 130 or the cell 170 is bent to have an angle α of 60° or less with respect to the center line of each base stepped groove 135 or the cell stepped groove 177.

Moreover, each base stepped groove 135 and each cell stepped groove 177 have inclined surfaces β formed unitarily on both sides in a transverse direction thereof.

Further, a back plate 200 is coupled correspondingly to the base 130 and the cells 170.

At this time, the back plate 200 is configured to allow the base 130 to be built in on a top surface thereof. That is, the top surface of the back plate 200 is concave to fix the base 130 thereto, thereby preventing light from scattering.

Further, the adjacent bases 130, the adjacent base 130 and cell 170, and the adjacent cells 170 are bent in the same direction as each other or in different directions from each other, and the adjacent bases 130 have the reflection surfaces 190 formed continuously in the same direction as each other or in different directions from each other.

Further, the base 130 is configured to have a shape of a cantilever B1 through the two incised holes 160 formed along the edges of each cell 170 or to have a shape of a double cantilever B2 through the three incised holes 160 formed along the edges of each cell 170.

According to the present invention, on the other hand, the metal PCB having a linear or geometric shape on the plane, while having the conductive patterns 110, is prepared.

Next, each cell 170 is punched on the base 130 of the metal PCB in such a manner as to be separated protrudingly from the base 130 in a state where only one surface thereof is connected to the base 130.

After that, the cell stepped groove 177 is formed on the underside of the cell 170 whose one surface is connected to the base 130, and the base stepped grooves 135 are formed on the base 130 in such a manner as to be in parallel to each other or maintained to given inclinations.

Next, top surfaces of the cell stepped grooves 177 are pressurized by means of punches to allow the plurality of cells 170 to be at the same time bent (Step S1).

Further, top or underside surfaces of the base stepped grooves 135 are pressurized by means of punches to allow the base 130 to be bent inward or outward to form the reflection surfaces 190 continuously in the same direction as each other or in different directions from each other (Step S2).

At this time, the step S2 of bending the base 130 to form the reflection surfaces 190 is divided into sub-steps S2-1, S2-2, and S2-3 performed sequentially, so that the reflection surfaces 190 are formed in different directions from each other to prevent the molds or punches from interfering with each other at the time when bending is carried out with the molds or punches.

In detail, as shown in FIG. 7, first positions d1 and second positions d2 which can be machined simultaneously and a third position d3 are in advance determined over the entire length of the base 130, and after that, bending for the respective positions is performed sequentially.

Figure 8:
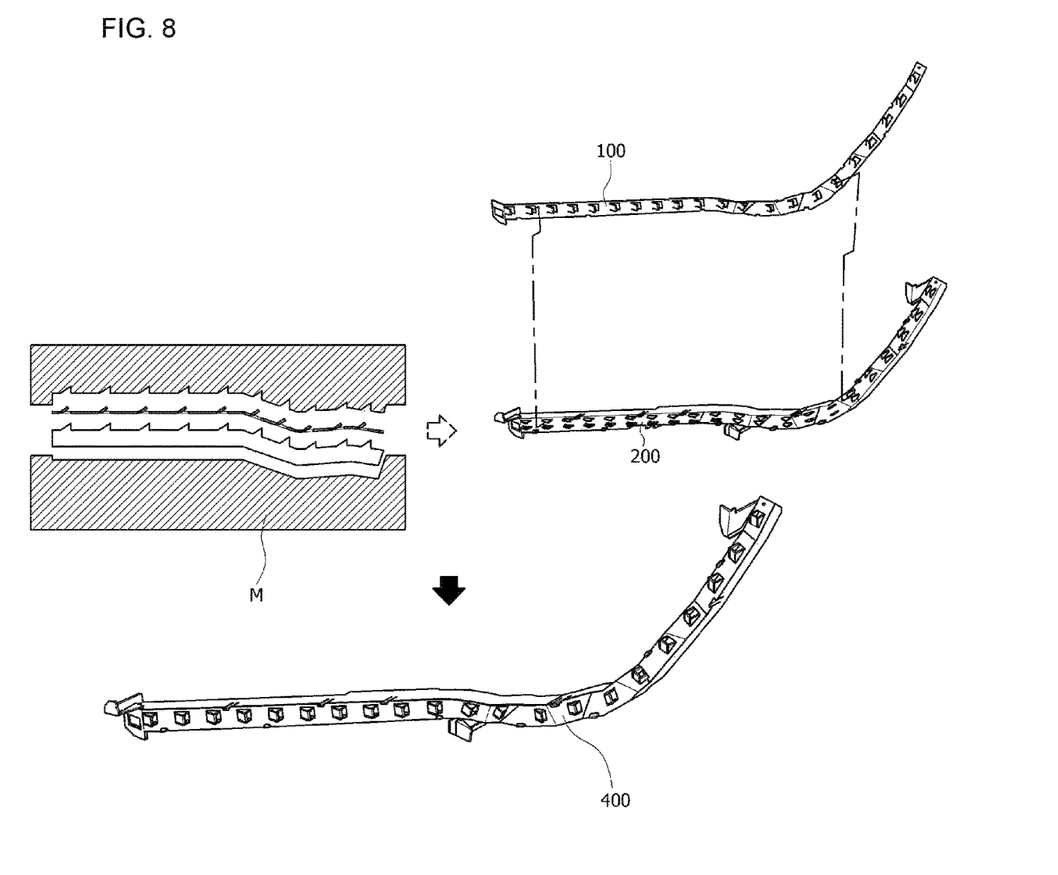
FIG. 8 is a sectional view showing a coupled state of an LED lamp according to the present invention.

Next, the back plate 200, which has support surfaces corresponding to the bent cells and reflection surfaces, is prepared, and as shown in FIG. 8, the base 130 and the back plate 200 are coupled integrally to each other by means of a mold (Step S3).

After that, at the time when both ends of the base 130 bent to have the reflection surfaces 190 continuously come into contact with the plane L, the base 130 has a geometric shape in which the base 130 is located in space through the reflection surfaces 190 continuously arranged.

Also, the base 130 is bent by means of a mold 330 having a punch 310 located on top or underside thereof and a concave portion 331 corresponding to the punch 310.

Further, as shown in FIG. 8, the base 130 and the cells 170 are mounted on the back plate 200 by means of a mold M to constitute an LED lamp 400.

At this time, the back plate 200 has coupling means integrally formed therewith to support the base 130 and the cells 170.

The coupling means is any one selected from bonding coupling, piece coupling, thermal fusion coupling, and locking hooks, so that through coupling between the metal PCB and the back plate 200, the LED lamp 400 can be manufactured.

Figure 6:
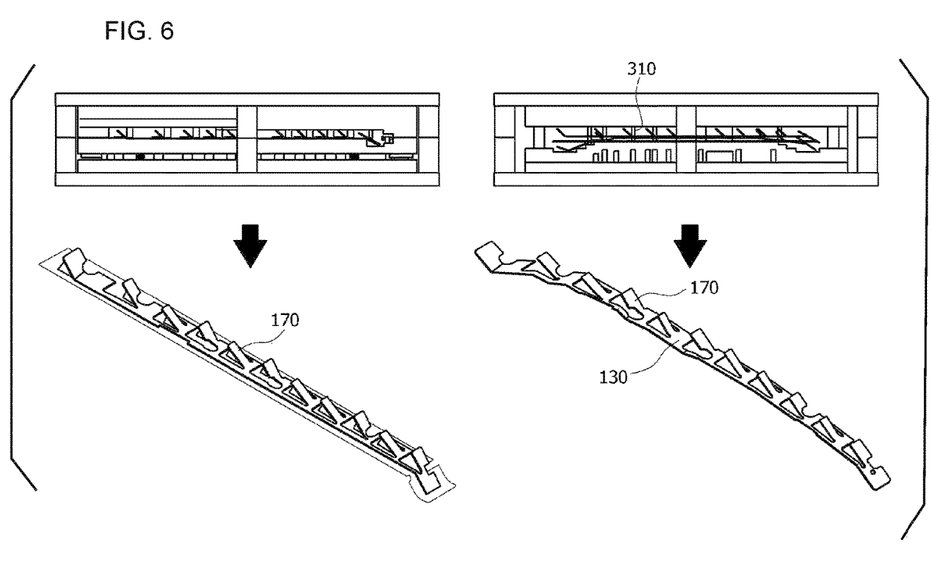
FIG. 6 is a side view showing the bent states of the base and cell in the metal PCB according to the present invention.
Figure 9:
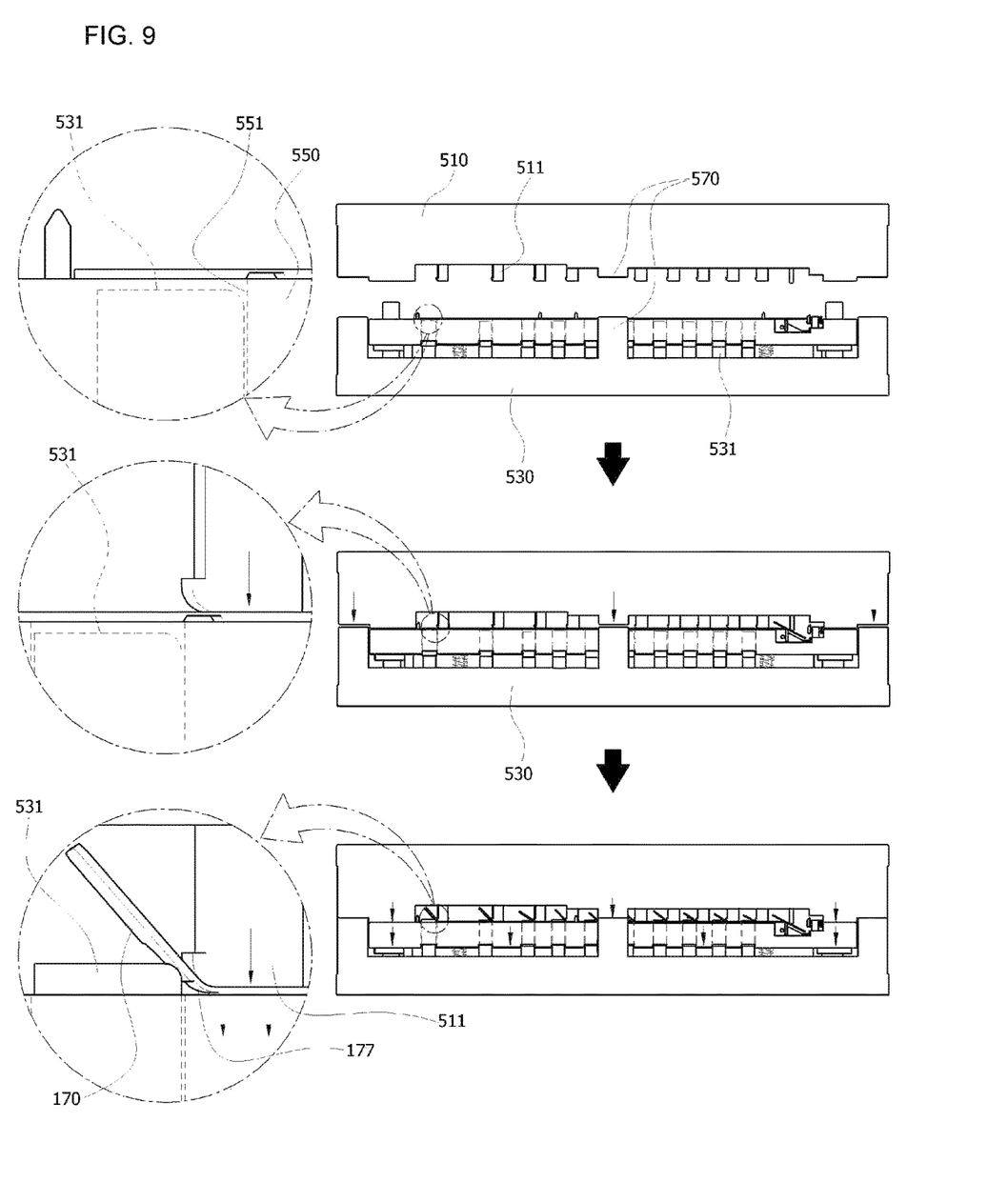
FIG. 9 is a flow diagram showing steps of bending the metal PCB according to the present invention.

As shown in FIGS. 6 and 9, the cells 170 are bent by means of an upper mold 510 having pressing plates 511 fixed to top and underside thereof in such a manner as to protrude downward from the underside thereof and sliders 550 elastically disposed on the top of a lower mold 530 in such a manner as to be pressurized against the pressing plates 511.

At this time, the lower mold 530 further includes fixing punches 531 exposed to pass through sliding holes 551 formed on the sliders 550 at the time when the sliders 550 are moved downward. When the upper mold 510 and the lower mold 530 come into contact with each other through stoppers 570, their position is determined, and the sliders 550 are moved inside them.

At the time when the pressing plates 511 are pressurized, the sliders 550 are moved downward to expose the fixing punches 531 of the lower mold 530, so that the fixing punches 531 serve to bend the cells supported on one side thereof by means of the pressing plates 511, while preventing the cells 170 from being deformed.

Further, contacted portions of each pressing plate 511 and each fixing punch 531 are arch-shaped to allow the cell 170 to be bent around the cell stepped groove 177, so that the cell 170 is protected from damages.

Under the above-mentioned configuration, now, an explanation on the metal PCB according to the present invention will be given.

As shown in FIGS. 2 to 9, the metal PCB 100 according to the present invention includes the base 130 as a plate-shaped thermal conductor made of aluminum, copper, or the like and the conductive patterns 110 formed integrally on top of the base 130 to mount the LED chips 175 thereon, so that the heat emitted from the LED chips 175 is easily radiated through the base 130 as the thermal conductor.

At this time, the metal PCB 100 is configured to allow a flexible board to be bonded to top of a radiation plate serving as the thermal conductor and having the plurality of cells 170 through a bonding layer, so that the flexible substrate and the radiation plate are laminated unitarily with each other.

Next, the LED chips corresponding to the cells are connected through the flexible substrate, and the bonding layer is formed with any one selected from a thermally conductive adhesive, a radiation adhesive, a thermal adhesive, and a thermally conductive silicone adhesive.

Further, the metal PCB 100 has the plurality of cells 170 formed on one side of the base 130 to have independent shapes, and at the time when the base 130 is bent to form the reflection surfaces 190 in a state where the cells 170 are fixed, next, the light sources of the LED chips 175 attached to the respective cells 170 on the front sides of the cells 170 are maintained in parallel to each other.

Further, the metal PCB 100 according to the present invention includes the plurality of cells 170 having the LED chips 175 mounted thereon, each cell 170 having one surface connected to the base 130 having the conductive patterns 110 formed on top thereof, and the base 130 has a shape of a rectangular or geometric band on the plane, so that it can be freely deformed in shape, for example, along a curved surface of an automobile.

At this time, the base 130 has the plurality of base stepped grooves 135 concavely shaped unitarily with the underside where no conductive patterns 110 are formed in such a manner as to be spaced apart from each other to be in parallel or inclined with respect to each other on the plane, and through the formation of the base stepped grooves 135, accordingly, the base 130 has the reflection surfaces 190 continuously formed at the time when it is bent in a desired upward or downward direction.

At this time, the reflection surfaces 190 have shapes of rectangle, square and trapezoid, and they are bent located on the same plane as each other or on different planes from each other, so that at the time when both ends of the base 130 come into contact with the plane L, the base 130 has a geometric shape in which the base 130 is located in space through the reflection surfaces 190 continuously arranged.

Further, the base 130 is made of an aluminum material having a thermal resistance of 30° C./w or less, and according to the present invention, at this time, the base 130 is made of an aluminum alloy, AL 5052.

Further, the depths of the cell stepped grooves 177 and the base stepped grooves 135 are formed to allow the aluminum base or cells serving as the radiating plate to have a thickness ranging from 0.4 to 0.6 mm. Also, the base 130 or the cell 170 is bent to have an angle α of 60° or less with respect to the center line of each base stepped groove 135 or each cell stepped groove 177.

It can be appreciated that optimal thickness and bending angle are obtained as follows under test conditions in Table 1.

First, if it is assumed that a state wherein the base 130 is left unattended at a temperature of 150° C. for 20 minutes and then left unattended at a temperature of −45° C. for 20 minutes is defined as one cycle, 1000 cycles are carried out, and next, a thermal shock test for a product is carried out, so that the optimal thickness and bending angles of the base 130 can be obtained.

On the test conditions, further, the base 130 is bent inward.

TABLE 1

| Division | | 0.2 mm | 0.3 mm | 0.5 mm | 0.7 mm |
|---|---|---|---|---|---|
| | | Bending angle (30) | | | |
| Rolling direction (V) | 2R (3.8 mm) | No problem | No problem | No problem | No problem |
| | 3R (4.2 mm) | No problem | No problem | No problem | No problem |
| | 4R (4.8 mm) | No problem | No problem | No problem | No problem |
| Rolling direction (H) | 2R (3.8 mm) | No problem | No problem | No problem | No problem |
| | 3R (4.2 mm) | No problem | No problem | No problem | No problem |
| | 4R (4.8 mm) | No problem | No problem | No problem | No problem |
| | | Bending angle (55) | | | |
| Rolling direction (V) | 2R (3.8 mm) | No problem | No problem | No problem | No problem |
| | 3R (4.2 mm) | No problem | No problem | No problem | No problem |
| | 4R (4.8 mm) | No problem | No problem | No problem | No problem |
| Rolling direction (H) | 2R (3.8 mm) | No problem | No problem | No problem | No problem |
| | 3R (4.2 mm) | No problem | No problem | No problem | No problem |
| | 4R (4.8 mm) | No problem | No problem | No problem | No problem |
| | | Bending angle (60) | | | |
| Rolling direction (V) | 2R (3.8 mm) | No problem | No problem | No problem | Crack found |
| | 3R (4.2 mm) | No problem | No problem | No problem | No problem |
| | 4R (4.8 mm) | Elongation found | No problem | No problem | No problem |
| Rolling direction (H) | 2R (3.8 mm) | Elongation found | No problem | No problem | Crack found |
| | 3R (4.2 mm) | No problem | No problem | No problem | No problem |
| | 4R (4.8 mm) | No problem | No problem | No problem | No problem |

As appreciated from Table 1, desirably, the base and cells of the metal PCB 100 is made of an aluminum thin film having a thickness ranging from 0.4 to 0.6 mm, and desirably, the base or cell is bent to a bending angle of 60° or less.

As appreciated from Table 1, in detail, if the base and cells of the metal PCB 100 have a thickness of 0.4 mm or less, elongation occurs at arbitrary bending angles on the cell stepped grooves or the base stepped grooves, thereby making reliability in a product deteriorated, and even if the base and cells of the metal PCB 100 have a thickness of 0.6 mm or more, cracks occur at arbitrary bending angles on the cell stepped grooves or the base stepped grooves, thereby making reliability in a product deteriorated. Therefore, the aluminum thin film desirably has a thickness ranging from 0.4 to 0.6 mm.

Further, the base and each cell are bent to have a bending angle of 60° or less with respect to the center line where no deformation occurs.

Further, each base stepped groove 135 and each cell stepped groove 177 have inclined surfaces β formed unitarily with both sides thereof in a transverse direction thereof, so that at the time when they are bent by means of the mold, the bending can be easily achieved, while preventing the base 130 from being damaged.

Furthermore, the back plate 200 is coupled correspondingly to the base 130 and the cells 170 through one process using a mold.

The adjacent bases 130, the adjacent base 130 and cell 170, and the adjacent cells 170 are bent in the same direction as each other or in different directions from each other, and the adjacent bases have the reflection surfaces 190 formed continuously in the same direction as each other or in different directions from each other, thereby maintaining the geometric shape.

Further, the base 130 is configured to have a shape of the cantilever B1 through the two incised holes 160 formed along the edges of each cell 170 or to have a shape of the double cantilever B2 through the three incised holes 160 formed along the edges of each cell 170.

Hereinafter, the method for manufacturing the LED lamp 400 according to the present invention will be explained.

First, the metal PCB, which has a linear or geometric shape on the plane, while having the conductive patterns 110, is prepared.

Next, each cell 170 is punched on the base 130 of the metal PCB in such a manner as to be separated protrudingly from the base 130 in a state where only one surface thereof is connected to the base 130, and the base 130 is configured to have the shape of the cantilever or double cantilever on the outside of each cell 170.

After that, the cell stepped groove 177 is formed on the underside of each cell 170 whose one surface is connected to the base 130, and the base stepped grooves 135 are formed on the base 130 in such a manner as to be in parallel to each other or maintained to given inclinations, so that the cells 170 are bent with respect to the base 130 or the reflection surfaces 190 are continuously formed on the base 130.

Next, top surfaces of the cell stepped grooves 177 are pressurized by means of punches to allow the plurality of cells 170 to be at the same time bent.

Further, top or underside surfaces of the base stepped grooves 135 are pressurized by means of punches to allow the base 130 to be bent inward or outward to form the reflection surfaces 190 continuously in the same direction as each other or in different directions from each other.

At this time, the step S2 of bending the base 130 to form the reflection surfaces 190 is divided into sub-steps S2-1, S2-2, and S2-3 which are performed sequentially so that the reflection surfaces 190 are formed in different directions from each other to prevent the molds or punches from interfering with each other at the time when bending is carried out with the molds or punches.

The sub-steps are selectively carried out according to conditions of the steps.

Next, the back plate 200, which has top support surfaces corresponding to the bent cells and reflection surfaces, is prepared, and accordingly, the base 130 and the back plate 200 are coupled integrally to each other by means of a mold.

Also, the base 130 is placed on the mold 330 having the punch 310 and the concave portion 331 corresponding to the punch 310 and is then pressurized against the punch 310, so that the base 130 can be bent.

Further, the base 130 and the cells 170 are coupled to the back plate 200 by means of the pair of upper and lower molds M having supports corresponding to their shape.

At this time, the back plate 200 has coupling means integrally formed therewith to support the base 130 and the cells 170, so that when it pressurizes the base 130 or the cells 170, it can be coupled integrally with the base 130 and the cells 170.

The coupling means is any one selected from bonding coupling, piece coupling, thermal fusion coupling, and locking hooks, so that through coupling between the metal PCB and the back plate 200, the LED lamp 400 can be manufactured.

The cells 170 are bent by means of the upper mold 510 having the pressing plates 511 fixed to top and underside thereof in such a manner as to protrude downward from the underside thereof and the sliders 550 elastically disposed on the top of the lower mold 530 in such a manner as to be pressurized against the pressing plates 511.

At this time, the lower mold 530 further includes the fixing punches 531 exposed to pass through the sliding holes 551 formed on the sliders 550 at the time when the sliders 550 are moved downward, so that when the upper mold 510 and the lower mold 530 come into contact with each other through the stoppers 570, the sliders 550 are moved inside them.

In detail, at the time when the pressing plates 511 are pressurized, the sliders 550 are moved downward to expose the fixing punches 531 of the lower mold 530, so that the fixing punches 531 serve to bend the cells 170 supported on one side thereof by means of the pressing plates 511, thereby preventing the cells 170 from being deformed.

As described above, the metal PCB to which the LED lamp is adopted and the back plate to which the metal PCB is coupled are coupled integrally with each other, thereby providing easiness in assembling and installation at the time when a headlight module for an automobile, to which the LED lamp is adopted, is manufactured.

In addition, the metal PCB according to the present invention is capable of performing accuracy in the raw material and the standard size to minimize damages to a product at the time when the metal PCB is bent, easily performing heat transfer, while being manufactured to various shapes, preventing damages thereto, while achieving the accuracy in angle adjustment for the cells, minimizing pressure collection on the stepped grooves, and preventing deformation from occurring upon molding, while heat transfer is being easily performed.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method for manufacturing an LED lamp having a metal PCB bent polyhedrally, the method comprising the steps of:

preparing the metal PCB having a linear or geometric shape on a plane, while having conductive patterns formed thereon;

punching edges of a plurality of cells so that each cell is separated protrudingly from a base of the metal PCB in such a manner as to allow one side thereof to be connected to the base;

forming a cell stepped groove on the underside of the cell whose one surface is connected to the base and forming base stepped grooves on the base in such a manner as to be in parallel to each other or maintained to given inclinations;

pressurizing top surfaces of the cell stepped grooves by means of punches to allow the cells to be at the same time bent;

pressurizing top or underside surfaces of the base stepped grooves by means of punches to allow the base to be bent inward or outward to form reflection surfaces continuously in the same direction as each other or in different directions from each other; and preparing a back plate having support surfaces corresponding to the bent cells and reflection surfaces and integrally coupling the base and the back plate by means of a mold, wherein the cells are bent by means of pressing plates and fixing punches fixed to upper and lower sides of a mold and sliders elastically disposed on the mold and having sliding holes adapted to expose the fixing punches to the outside, so that at the time when the pressing plates are pressurized, the cells are bent by means of the fixing punches, while being prevented from being deformed through the pressing plates.

2. The method according to claim 1, wherein at the time when both ends of the base come into contact with the plane, the base has a geometric shape in which the base is located in space through the continuous reflection surfaces.

3. The method according to claim 1, wherein the base is bent by means of a mold having a punch and a concave portion corresponding to the punch.

4. The method according to claim 3, wherein the step of bending the base to form the reflection surfaces is divided into a plurality of steps carried out sequentially on the entire surface of the base so as to prevent interference between molds.

5. The method according to claim 1, wherein the base and the cells are mounted on the back plate by means of the mold, and the back plate has coupling means integrally formed therewith to support the base and the cells, the coupling means being any one selected from bonding coupling, piece coupling, thermal fusion coupling, and locking hooks.

* * * * *